United States Patent [19]

Goto

[11] Patent Number: 4,859,624

[45] Date of Patent: Aug. 22, 1989

[54] MANUFACTURING METHOD OF SEMICONDUCTOR DEVICE HAVING CCD AND PERIPHERAL CIRCUIT

[75] Inventor: Hiroshige Goto, Yokohama, Japan

[73] Assignee: Kabushiki Kaisha Toshiba, Kawasaki, Japan

[21] Appl. No.: 226,032

[22] Filed: Jul. 29, 1988

[30] Foreign Application Priority Data

Jul. 31, 1987 [JP] Japan ................. 62-192069

[51] Int. Cl.⁴ .................. H01L 29/96; H01L 21/38
[52] U.S. Cl. ........................ 437/53; 437/26; 357/91; 357/42; 357/24
[58] Field of Search ............... 437/53, 20, 26; 357/24, 357/91, 24 M, 42

[56] References Cited

U.S. PATENT DOCUMENTS

| | | | |
|---|---|---|---|
| 4,024,563 | 5/1977 | Tasch, Jr. | 357/91 |
| 4,047,215 | 9/1977 | Frye et al. | 357/91 |
| 4,216,574 | 8/1980 | Feist | 437/26 |
| 4,285,000 | 8/1981 | Deyhimy et al. | 357/56 |
| 4,362,575 | 12/1982 | Wallace | 437/53 |
| 4,584,697 | 4/1986 | Hazendonk et al. | 357/24 |
| 4,603,426 | 7/1986 | Sauer | 357/24 M |
| 4,642,877 | 2/1987 | Garner et al. | 437/54 |
| 4,667,213 | 5/1987 | Kosonocky | 357/30 R |

FOREIGN PATENT DOCUMENTS

| | | | |
|---|---|---|---|
| 0086155 | 6/1980 | Japan | 357/24 |
| 0019666 | 2/1981 | Japan | 357/24 |
| 0035572 | 2/1985 | Japan | 357/42 |
| 0091671 | 5/1985 | Japan | 357/24 |
| 0132367 | 7/1985 | Japan | 357/24 |
| 0223161 | 11/1985 | Japan | 357/24 |

OTHER PUBLICATIONS

R. Dawson et al., "A CMOS/Buried-n-Channel CCD Compatible Process for Analog Signal Processing Applications," RCA Review, vol. 38, 1977, pp. 406–635.

Primary Examiner—Brian E. Hearn
Assistant Examiner—Tuan Nguyen
Attorney, Agent, or Firm—Foley & Lardner, Schwartz, Jeffery, Schwaab, Mack, Blumenthal & Evans

[57] ABSTRACT

In a method of manufacturing a semiconductor device which has a CCD and its peripheral circuit on the same substrate, a buried channel for a CCD and an impurity diffusion region for peripheral circuit transistors are formed at the same time by a single process, the impurity diffusion region being of the same conductivity type as that of the buried channel.

4 Claims, 3 Drawing Sheets

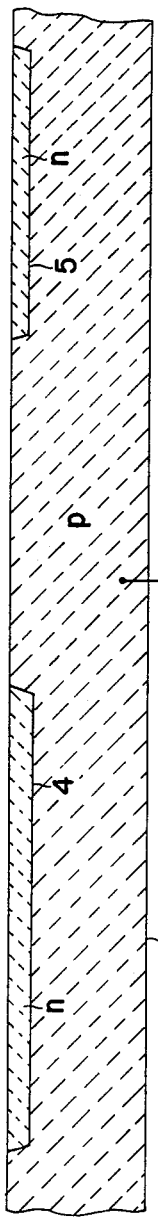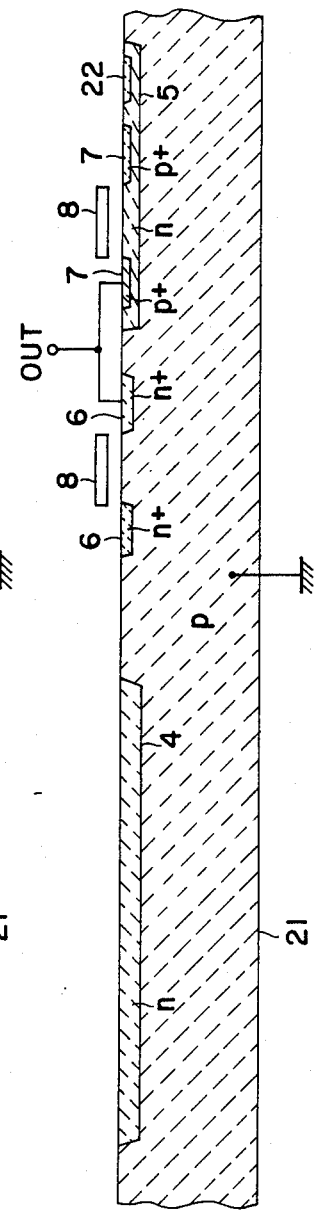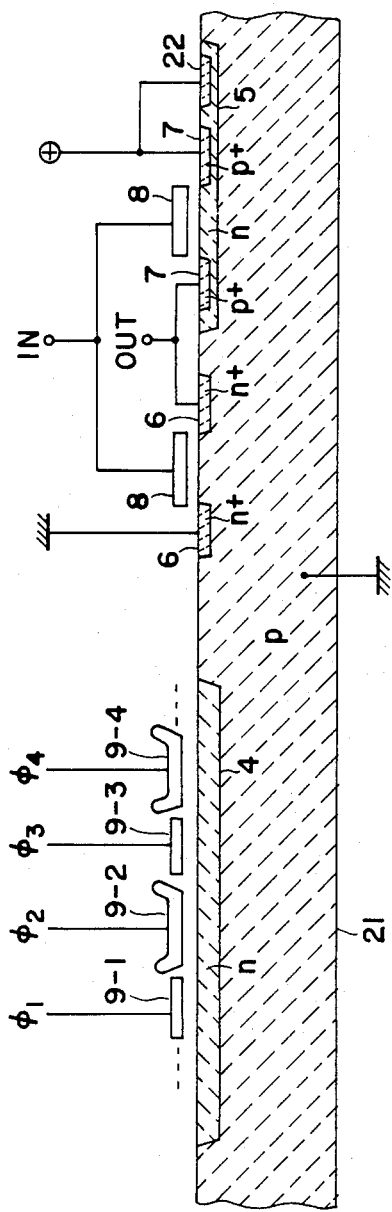

MANUFACTURING METHOD OF SEMICONDUCTOR DEVICE HAVING CCD AND PERIPHERAL CIRCUIT

BACKGROUND OF THE INVENTION

The present invention relates to a method of manufacturing a semiconductor integrated circuit device, and more particularly to a method of manufacturing a semiconductor device used as an image sensing device having a charge coupled device (CCD) and its peripheral circuits on the same substrate.

Recently, a CCD, a driver for driving the CCD, a logical circuit for processing signal and the like are fabricated on the same semiconductor substrate as an integrated one-chip device. The fabrication of the CCD and its peripheral circuit on the same substrate has many advantages in system construction, such as omission of external clock lines, and an improved operation speed of the entire system.

An example of such devices is disclosed, e.g., in a paper of a title "CCD Delay Line with Integrated CMOS Driver" by Sakagami et al., presented at the Joint Meeting of Four Electric Societies in Japan, 1977, pp. 4-28 to 4-31.

A semiconductor device having a CCD and its peripheral transistor circuit fabricated on the same substrate, however, is necessarily associated with the problem of a low threshold level of transistors in the peripheral circuit, thus resulting in a small logical amplitude margin of CMOS transistors and a liability to defective operation.

SUMMARY OF THE INVENTION

It is therefore an object of the present invention to provide a method of manufacturing a semiconductor device whereby a high threshold level and stable operation of transistors are ensured.

According to the present invention, a method of manufacturing a semiconductor device comprises the steps of forming a buried channel for a CCD in a semiconductor substrate, and forming an impurity diffusion region within which a transistor for a peripheral circuit of the CCD having a conductivity type opposite to that of the buried channel is formed, the impurity diffusion region being of the same conductivity type as that of the buried channel, wherein said buried channel and said impurity diffusion region are formed at the same time by a single process.

According to this method, a single process is employed in forming at the same time the buried channel for a CCD and the impurity diffusion region in which a transistor having a conductivity type opposite to that of the buried chennel, the impurity diffusion region being of the same conductivity type as that of the buried region. Therefore, the impurity concentration of the impurity diffusion region for peripheral circuit transistors can be made substantially high so as to accordingly ensure stable operation. In addition, since a substrate with a low impurity concentration can be used, a stable well can be formed. Also, since a single process is used in forming the buried channel and the corresponding impurity region, the overall manufacturing processes can be simplified.

Preferred embodiments of this invention will be described with reference to the accompanying drawings.

BRIEF DESCRIPTION OF THE DRAWINGS

FIGS. 3A, 3B and 3C show cross sections illustrating the manufacturing steps of another embodiment according to this invention.

DESCRIPTION OF THE PREFERRED EMBODIMENTS

The problems inherent to a prior art will first be described with reference to FIG. 1.

Figure 1:
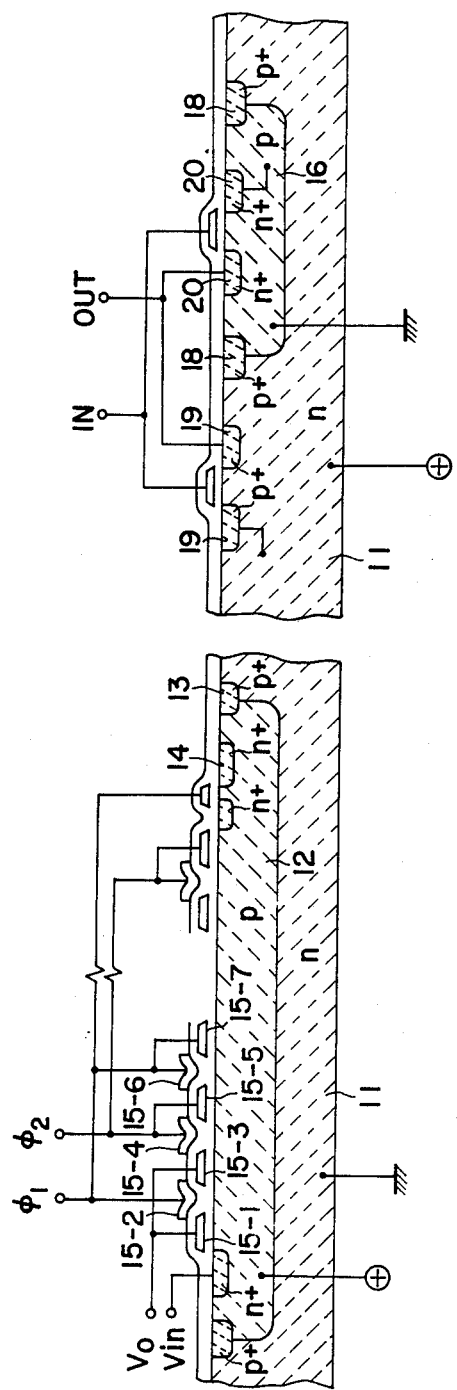
FIG. 1 is a cross section showing the construction of a semiconductor device.

The semiconductor device shown in FIG. 1 has an n-type substrate 11 in which a p-well 12 having channel stoppers 13 and n-type regions 14 are formed. A surface channel type CCD having electrodes 15-1, . . . 15-7 is formed in the p-well 12. In the same substrate, there are formed a p-channel MOS transistor having p-type regions 19, and an n-channel MOS transistor in another p-well 16 having channel stoppers 18. It is possible to avoid an increase of dark current of the CCD due to the temperature rise of the chip in a case in which the size of a circuit constructed of C-MOS transistors described above becomes large.

Surface channel type CCDs shown in FIG. 1 have a poor transfer efficiency so that a buried channel structure is often used. In this case, an n-type impurity layer is formed by means of ion implantation into the channel region of a CCD formed in a p-well. In order to form a stable n-type impurity layer, it is desirable to make low the impurity concentration of the p-well. Since the p-well is also formed by means of ion implantation, it is also desirable to make low the impurity concentration of the n-type substrate. As a result, the impurity concentrations of the n-type substrate and the n-type impurity layer in the channel region differ from each other by about several hundred times.

If peripheral circuit CMOS transistors are formed using a substrate of a low impurity concentration, the absolute threshold level of a p-type MOS transistor formed in the n-type substrate becomes low, which poses the above-mentioned problem.

The present invention will now be described below.

Figure 2A:
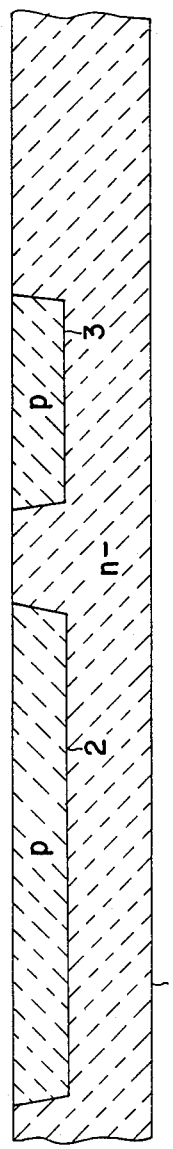
FIGS. 2A, 2B and 2C show cross sections illustrating the manufacturing steps of an embodiment according to this invention.
Figure 2B:
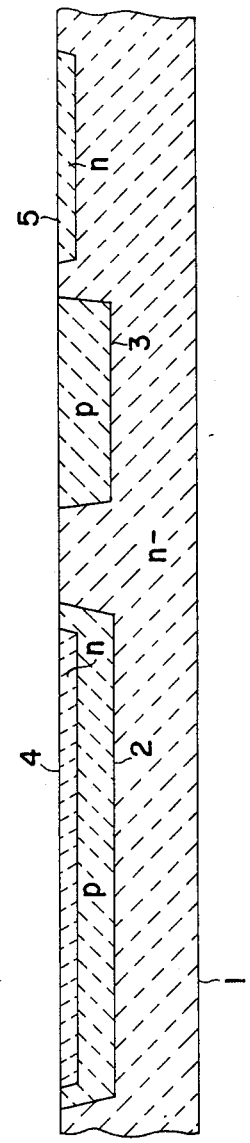
Figure 2C:
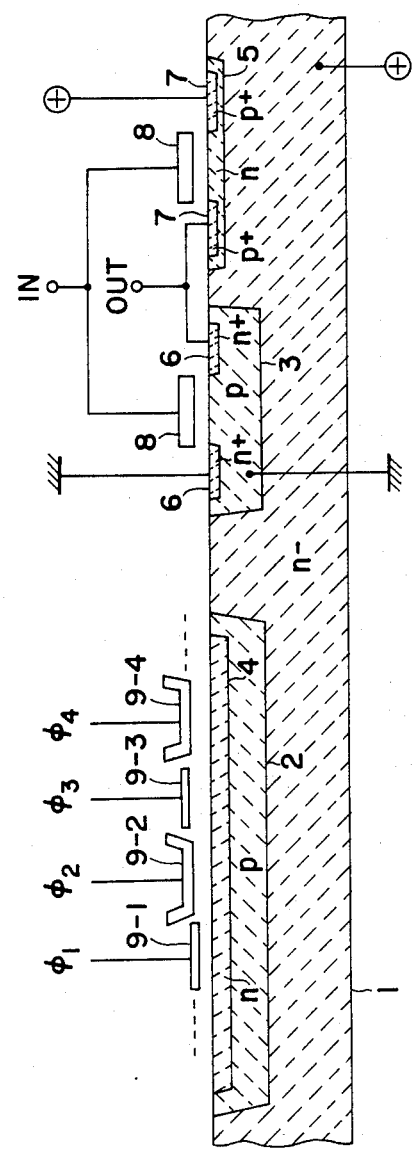

FIGS. 2A, 2B and 2C show cross sections illustrating the manufacturing steps of an embodiment of this invention.

First, an n$^-$—type semiconductor substrate 1 is prepared. After a resist serving as a mask for ion implantation is deposited to expose necessary regions only, boron is ion-implanted to form a p-well region 2 for a CCD and a p-well region 3 for an n-channel CMOS transistor for a peripheral circuit (FIG. 2A). The resistivity of the p-well regions 2 and 3 is of the order of several ohm-cm.

Next, a resist serving as a mask for ion implantation is deposited to expose the p-well region 2 for a CCD and the substrate region in which a p-channel CMOS transistor for the peripheral circuit is formed. Thereafter a buried channel region 4 and an n-type region 5 for a p-channel transistor are formed at the same time by an ion implantation of phosphorus (FIG. 2B). The dose of this ion implantation is higher than that for the p-well shown in FIG. 2A by several tens times. Therefore, although the impurity concentration of the substrate is low, the impurity concentration of the n-type regions in which a p-channel transistor is formed becomes high so that the threshold level of the transistor becomes high.

Next, electrodes 8 for the CMOS transistors are formed by means of a known method such as patterning of polycrystalline silicon film and thereafter, n+ regions 6 for the sources/drains of n-channel transistors in the p-well 3 and p+ regions 7 for the sources/drains of p-channel transistors are formed in the n-type region 5, respectively, by using the electrodes 8 as its masks for ion implantation. Thereafter, four-phase transfer electrodes 9-1, ... 9-4 are formed above the buried channel 4 for a CCD. Desired wirings are formed by means of vapor deposition and patterning of aluminum or the like conductor to obtain a finished semiconductor device (FIG. 2C).

FIGS. 3A, 3B and 3C show cross sections ilustrating the manufacturing steps of another embodiment according to this invention.

The difference between the embodiment shown in FIGS. 3A, 3B and 3C and that shown in FIGS. 2A, 2B and 2C lies in the use of a p-type substrate 21 instead of an n⁻—type substrate. Therefore, a buried channel 4 for a CCD and an n-type region in which a p-type CMOS transistor is formed can be formed at the same time without a necessity of forming the of wells (FIG. 3A).

Next, gate electrodes 8 are formed in a region in which CMOS transistors are to be formed, by means of deposition and patterning of polycrystalline silicon film. n+regions 6 and p+regions 7 are to be formed in the substrate 21 and the n-type region 5, respectively, by using the gate electrodes 8 as an ion implantation mask (FIG. 3B). In this embodiment, in order to hold the n-type region 5 at a predetermined potential, an n+region 22 of a high impurity concentration is formed in the n-type region 5.

Next, four-phase transfer electrodes 9-1~9-4 are formed by means of polycrystalline silicon multi-layer technique. Finally, desired wirings are of performed by means of vapor deposition and patterning of aluminum or the like conductor to obtain a finished semiconductor device (FIG. 3C).

In this embodiment, it is not necessary to form a p-well so that the manufacturing processes can be further simplified.

In the above-described embodiments, the transfer electrodes for a CCD and the gate electrodes for CMOS transistors are formed using separate processes. However, they may be formed at the same time using a single process.

Although, in the above-described embodiments, the four-phase transfer electrodes for a CCD have been used, the invention is not limited thereto, and the two-phase, three-phase and other types of transfer electrodes may be used.

Further, if the threshold value of an n-channel MOS transistor within a p-well is not sufficiently large, ion implantation for ajdusting the threshold value may be made between the source and drain.

What is claimed is:

1. A method of manufacturing a semiconductor device comprising the steps of:
    forming a buried channel for a CCD in a semiconductor substrate; and
    forming an impurity diffusion region in which a transistor for a peripheral circuit of the CCD having a conductivity type opposite to that of the buried channel is formed, the impurity diffusion region being of the same conductivity type as that of the buried channel; and
    wherein said buried channel and said impurity diffusion region being formed at the same time by a single process.

2. The method of manufacturing a semiconductor device according to claim 1, wherein said buried channel and said impurity diffusion region are formed through ion implantation.

3. The method of manufacturing a semiconductor device according to claim 1, wherein said substrate, said buried channel and said impurity diffusion region of the same conductivity as that of said buried channel are all of n-type.

4. The method of manufacturing a semiconductor device according to claim 3, further comprising the steps of forming a p-well for CCD in said substrate, and forming an n-type buried channel in said p-type well.

* * * * *